United States Patent [19]

Kauchi et al.

[11] Patent Number: 5,101,264
[45] Date of Patent: Mar. 31, 1992

[54] LIGHT-EMITTING OR RECEIVING DEVICE WITH SMOOTH AND HARD ENCAPSULANT RESIN

[75] Inventors: Kakutaro Kauchi; Toru Tomoshige, both of Kimitsu; Shoji Usuda; Hideyuki Kitayama, both of Osaka, all of Japan

[73] Assignees: Mitsui Petrochemical Ind., Tokyo; IDEC Izumi Corp., Osaka, both of Japan

[21] Appl. No.: 329,566

[22] Filed: Mar. 28, 1989

[30] Foreign Application Priority Data

Mar. 31, 1988 [JP] Japan .................................. 63-78909
Mar. 31, 1988 [JP] Japan .................................. 63-78910

[51] Int. Cl.$^5$ ..................... H01L 23/28; H01L 23/30
[52] U.S. Cl. ..................................................... 357/72
[58] Field of Search ..................... 357/17, 72; 526/261

[56] References Cited

U.S. PATENT DOCUMENTS

4,521,577  6/1985  Romano et al. .................... 526/261
4,623,705 11/1986  Romano et al. .......................... 526/75

FOREIGN PATENT DOCUMENTS

0110447 10/1983  European Pat. Off. .
0114080  1/1984  European Pat. Off. .
58-186976 11/1983  Japan .
59-8710  1/1984  Japan .
103650  6/1985  Japan .

*Primary Examiner*—Rolf Hille
*Assistant Examiner*—S. V. Clark

[57] ABSTRACT

There is provided a light-emitting or receiving device having improved weatherability, chemical resistance, hardness, and optical properties, wherein a light-emitting or receiving element is encapsulated with a polymer of a polymerizable liquid composition comprising (a) a monomer or an oligomer or a mixture thereof containing a diallyl compound as an essential ingredient.

There is also provided an encapsulant and a method for encapsulating a light-emitting or receiving element.

6 Claims, 1 Drawing Sheet

LIGHT-EMITTING OR RECEIVING DEVICE WITH SMOOTH AND HARD ENCAPSULANT RESIN

BACKGROUND OF THE INVENTION

This invention relates to light-emitting or receiving devices (or parts) such as LED, laser diodes, and photosensors, and more particularly, to encapsulants having improved weatherability, chemical resistance, hardness, and optical properties and light-emitting or receiving devices using the same and having such improved properties.

This invention further relates to an encapsulating method useful in the manufacture of light-emitting or receiving devices.

In the prior art manufacture of light-emitting or receiving devices such as LED, laser diodes, and photosensors, light-emitting diodes and similar elements are encapsulated by casting epoxy resin followed by polymerization.

The encapsulating method using epoxy resin, however, has the following drawbacks.

(1) Since the epoxy resin has poor weatherability, its outdoor use is substantially limited. This is because light-emitting elements experience a drastic drop in luminous power with a lapse of time and light-receiving elements experience a drop in light-receiving sensitivity with a lapse of time when used outdoors.

(2) Since it takes a long time of 5 to 20 hours to cure the epoxy resin, the productivity of light-emitting or receiving devices is low.

(3) Since the epoxy resin has poor mold release characteristics, the productivity of light-emitting or receiving devices is low.

If a mold release agent is used to improve mold release, it is necessary to remove the mold release agent adhered to the surface of the epoxy resin encapsulant, creating a serious problem in the production process.

SUMMARY OF THE INVENTION

An object of the present invention is to overcome the above-mentioned problems of the prior art and to provide a light-emitting or receiving device having improved weatherability, chemical resistance, hardness, and optical properties.

Another object of the present invention is to provide an encapsulant for light-emitting or receiving elements which is used to form light-emitting or receiving devices having the above-mentioned properties and characterized by a reduced curing time and good mold release.

Another object of the present invention is to provide an encapsulating method suitable for the manufacture of a light-emitting or receiving device (or part) having improved weatherability, chemical resistance, hardness, and optical properties.

According to a first aspect of the present invention, there is provided a light-emitting or receiving device wherein a light-emitting or receiving element is encapsulated with a polymer of a polymerizable liquid composition comprising (a) a monomer or an oligomer or a mixture thereof containing a diallyl compound as an essential ingredient.

According to a second aspect of the present invention, there is provided an encapsulant for light-emitting or receiving elements, comprising (a) a monomer or an oligomer or a mixture thereof containing a diallyl compound as an essential ingredient.

According to a first aspect of the present invention, there is provided a method for encapsulating a light-emitting or receiving element, comprising placing a light-emitting or receiving element in a mold, casting an encapsulant [A] comprising (a) a monomer or an oligomer or a mixture thereof containing a diallyl compound as an essential ingredient into the mold, and polymerizing encapsulant [A].

According to a second aspect of the present invention, there is provided a method for encapsulating a light-emitting or receiving element, comprising placing a light-emitting or receiving element in a mold, casting an encapsulant [A] comprising (a) a monomer or an oligomer or a mixture thereof containing a diallyl compound as an essential ingredient into the mold, and polymerizing encapsulant [A] while a liquid [C] having less solubility in encapsulant [A] and a lower density than encapsulant [A] is present on encapsulant [A].

According to a third aspect of the present invention, there is provided a method for encapsulating a light-emitting or receiving element, comprising placing a light-emitting or receiving element in a mold, casting an encapsulant [A] comprising (a) a monomer or an oligomer or a mixture thereof containing a diallyl compound as an essential ingredient into the mold, and polymerizing encapsulant [A] while keeping the surface of encapsulant [A] in contact with an inert gas atmosphere having an oxygen concentration of up to 1%.

The polymerizable liquid composition comprising (a) a monomer or an oligomer or a mixture thereof of a bis(allyl carbonate) of an aliphatic, cycloaliphatic or aromatic dihydric alcohol as an essential ingredient is preferred.

The liquid [C] is preferred a liquid synthetic hydrocarbon polymer having a low molecular weight or a liquid hydrocarbon mixture or a mixture thereof.

The monomer or oligomer or mixture thereof containing a diallyl compound as an essential ingredient used in the present disclosure encompasses a monomer alone, an oligomer alone, a mixture of a monomer and an oligomer, a mixture of two or more monomers, a mixture of two or more oligomers, and a mixture of at least one monomer and at least one oligomer.

The polymer used in the present disclosure may be either a homopolymer or a copolymer.

DETAILED DESCRIPTION OF THE INVENTION

Figure 1:
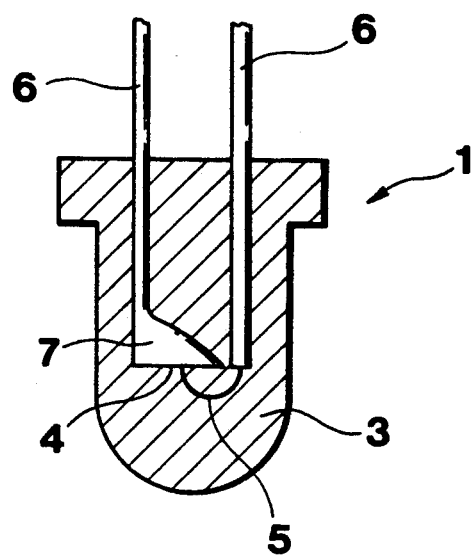
FIG. 1 is a vertical cross section of a light-emitting or receiving device according to the present invention.

The invention will be described in detail by referring to the preferred embodiments shown in the drawings.

FIG. 1 illustrates one preferred embodiment of the light-emitting or receiving device according to the present invention.

The light-emitting or receiving device 1 according to the present invention may be any such device and is not particularly limited in shape or the like insofar as a light-emitting or receiving element 4, for example, a diode 4 (such as light-emitting diode or ultraviolet light-emitting diode) is encapsulated with a specific polymer 3.

In general, lead frames 6 and 6 which project beyond the polymer 3 are provided on the upper surface of the polymer 3. One lead frame 6 is connected to a die bonding electrode 7 to which the light-emitting or receiving element 4 is secured. The other lead frame 6 is connected to a bonding wire 5 such as a gold wire. The bonding wire 5 is connected to the light-emitting or receiving element 4.

A lower portion of the lead frames 6, die bonding electrode 7, and bonding wire 5 are sealed in the polymer 3.

The light-emitting or receiving device of the present invention is characterized by encapsulation with a specific polymer, more particularly by encapsulation with a polymer of a polymerizable liquid composition (to be referred to as encapsulant A, hereinafter) comprising (a) a monomer or an oligomer or a mixture thereof containing a diallyl compound as an essential ingredient.

The encapsulant [A] prior to polymerization into the polymer with which the light-emitting or receiving device of the present invention is encapsulated is a polymerizable liquid composition comprising (a) a monomer or an oligomer or a mixture thereof containing a diallyl compound as an essential ingredient, preferably comprising (a) a monomer or an oligomer or a mixture thereof of a bis(allyl carbonate) of an aliphatic, cycloaliphatic or aromatic dihydric alcohol as an essential ingredient.

Examples of the diallyl compounds include a composition comprising (a') a monomer or an oligomer or a mixture thereof of a bis(allyl carbonate) of an aliphatic, cycloaliphatic or aromatic dihydric alcohol having the general formula:

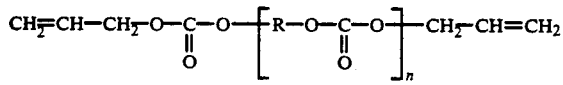

wherein R is a residue of a dihydric alcohol, and n has a value or an average value in the range of from 1 to 10, preferably from 2 to 10.

Component (a') is preferably the reaction product of diallyl carbonate and a dihydric alcohol in a molar ratio of 4:1 or lower, more preferably in a molar ratio of 2:1.

Preferred examples of the dihydric alcohol include ethylene glycol, 1,3-propanediol, 1,4-butanediol, 1,6-hexanediol, diethylene glycol, polyethylene glycol, dipropylene glycol, propylene glycol, neopentyl glycol, trimethylpentane diol, cyclohexane dimethanol, bis(hydroxymethyl)tricyclodecane, 2,7-norbornane diol, α,α'-xylene diol, 1,4-bis(hydroxyethoxybenzene), and 2,2-bis[4-(hydroxyethoxy)phenyl]propane alone and mixtures thereof.

The encapsulant [A] of the present invention is preferably a liquid composition comprising components (a″), (b), and (c) shown below. Japanese Patent Application Kokai No. 59-140214 is incorporated herein by reference.

The preferred composition comprises (a″) 10 to 90% by weight of an oligomer or a mixture of oligomers of a bis(allyl carbonate) of an aliphatic, cycloaliphatic or aromatic dihydric alcohol having the general formula:

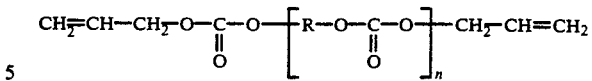

wherein R is a residue of a dihydric alcohol, and n has a value or an average value in the range of from 1 to 10, preferably from 2 to 10, with the proviso that the content of a dihydric alcohol bis(allyl carbonate) monomer optionally present in the oligomer is up to 50% by weight;

(b) 0 to 90% by weight of a compound selected from the group consisting of (b-1) a monomeric di- or tri(allyl carbonate) of an aliphatic, cycloaliphatic or aromatic di- or trihydric alcohol having the general formula:

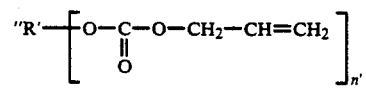

wherein R' is a residue of a di- or trihydric alcohol, and n' is equal to 2 or 3, or a mixture thereof, with the proviso that the content of an oligomeric di(allyl carbonate) of a di- or trihydric alcohol or a poly(allyl carbonate) of a di- or trihydric alcohol optionally present in the monomer or the mixture is up to 30% by weight, (b-2) an allyl ester of an aliphatic or aromatic di- or tricarboxylic acid having the general formula:

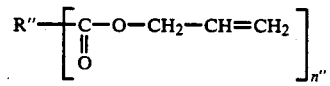

wherein R″ is a residue of a di- or tricarboxylic acid, and n″ is equal to 2 or 3, and (b-3) triallyl cyanurate and triallyl isocyanurate; and (c) 0 to 30% by weight of an acrylic or vinyl monomer; with the proviso that the total of components (b) and (c) is more than 0.

The preferred component (a″) is the reaction product of diallyl carbonate and a dihydric alcohol in a molar ratio of 4:1 or lower, more preferably in a molar ratio of 2:1. The dihydric alcohol is preferably selected from the group consisting of ethylene glycol, 1,3-propanediol, 1,4-butanediol, 1,6-hexanediol, diethylene glycol, polyethylene glycol, dipropylene glycol, propylene glycol, neopentyl glycol, trimethylpentane diol, cyclohexane dimethanol, bis(hydroxymethyl)tricyclodecane, 2,7-norbornane diol, α,α'-xylene diol, 1,4-bis(hydroxyethoxybenzene), and 2,2-bis[4-(hydroxyethoxy)phenyl]propane.

The preferred component (b) is the reaction product of diallyl carbonate and a di- or trihydric alcohol in a molar ratio of 6:1 or higher, more preferably in a molar ratio of 12:1. The di- or trihydric alcohol is preferably selected from the group consisting of ethylene glycol, 1,3-propanediol, 1,4-butanediol, 1,6-hexanediol, diethylene glycol, polyethylene glycol, dipropylene glycol, propylene glycol, neopentyl glycol, trimethylpentane diol, cyclohexane dimethanol, bis(hydroxymethyl)tricyclodecane, 2,7-norbornane diol, α,α'-xylene diol, 1,4-bis(hydroxyethoxybenzene), 2,2-bis[4-(hydroxyethoxy)phenyl]propane, trimethylol propane, and tri(hydroxyethyl) isocyanurate alone and mixtures thereof.

Also included in component (b) are diallyl phthalate, diallyl succinate, diallyl adipate, diallyl chlorendate, diallyl glycolate, diallyl naphthalene dicarboxylate, and triallyl mellitate.

Component (c) is preferably selected from vinyl acetate, vinyl benzoate, methyl methacrylate, phenyl methacrylate, methyl acrylate, methyl maleate, maleic anhydride, and vinylidene chloride alone and mixtures thereof.

Other examples of the diallyl compounds include (I) a copolymerizable composition comprising a diallyl ester of a nuclearly halo-substituted benzene dicarboxylic acid and diethylene glycol diallyl carbonate as disclosed in Japanese Patent Application Kokai No. 59-45312;

(II) a copolymerizable composition comprising at least one ester of a nuclearly halo-substituted benzene dicarboxylic acid (for example, bisallyl 2,4-dichloroterephthalate) and at least one radical-polymerizable monofunctional monomer bearing an aromatic ring and capable of forming a homopolymer having a refractive index of at least 1.55 (for example, phenyl methacrylate) as disclosed in Japanese Patent Application Kokai No. 59-8709;

(III) a copolymerizable composition comprising at least one bisallyl carbonate or bis-β-methylallyl carbonate (for example, 1,4-bis(hydroxyethoxy)benzene bisallyl carbonate) and at least one radical-polymerizable monofunctional monomer bearing an aromatic ring and capable of forming a homopolymer having a refractive index of at least 1.55 (for example, phenyl methacrylate) as disclosed in Japanese Patent Application Kokai No. 59-8710;

(IV) a copolymerizable composition comprising a monomer obtained by reacting a monool (for example, 4-benzyl-phenol) with an unsaturated carboxylic acid or chloride thereof (for example, acrylic acid or chloride thereof) and a radical-polymerizable monomer capable of forming a homopolymer having a refractive index of at least 1.55 (for example, styrene) as disclosed in Japanese Patent Application Kokai No. 59-96109;

(V) a copolymerizable composition comprising a chlorobenzoic acid allyl ester (for example, 2,3-dichlorobenzoic acid diallyl ester) and a difunctional monomer (for example, tetrabromophthalic acid diallyl ester) as disclosed in Japanese Patent Application Kokai No. 59-96113;

(VI) a copolymerizable composition as disclosed in Japanese Patent Application Kokai No. 59-184210;

(VII) diethylene glycol bisallyl carbonate; and (VIII) copolymereizable compositions of a bisallyl compound such as diethylene glycol bisallyl carbonate, 1-4-bis(hydroxyethoxy)benzene bisallyl carbonate, and 2,4-dichloroterephthalic acid bisallyl ester and a vinyl monomer having an aromatic ring such as phenyl methacrylate and benzyl methacrylate.

The polymerizable liquid composition may contain another monomer and a filler in such amounts that they do not detract from the physical properties of the resulting polymer. For example, a mono (meth)acrylic compound, di(meth)acrylic compound, or unsaturated carboxylic acid such as maleic anhydride may be added in an amount of up to 30% by weight, or a silane coupling agent such as vinyl triethoxysilane may be added in an amount of up to 10% by weight, based on the weight of the polymer.

In the practice of the present invention, encapsulant [A] may further contain a polymerization initiator [B].

The polymerization initiator [B] used in polymerizing encapsulant [A] may be any of photo polymerization initiators, thermal polymerization initiators, and photo and thermal polymerization initiators, and mixtures thereof.

The photo polymerization initiators include electron beam and radiation polymerization initiators as well as photo polymerization initiators.

A typical example of the photo polymerization initiator is 2-hydroxy-2-methyl-1-phenyl-propan-1-one.

Examples of the thermal polymerization initiators include peroxydicarbonates such as diisopropyl peroxydicarbonate, di-sec-butyl peroxydicarbonate, dicyclohexyl peroxydicarbonate, and tert-butyl perbenzoate; organic peroxides such as benzoyl peroxide, acetyl peroxide, tert-butyl hydroperoxide, cumene hydroperoxide, di-tert-butyl peroxide, tert-butyl peroxybenzoate, lauroyl peroxide, diisopropyl peroxydicarbonate, dimethyl ethyl ketone peroxide, and diacyl peroxide; and radical initiators such as azobisisobutyronitrile and azobismethylisovaleronitrile.

A typical example of the photo and thermal polymerization initiators is the compound of the following formula:

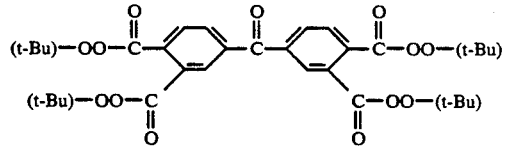

Polymerization initiator [B] may be used to polymerize encapsulant [A] in an amount of 0.1 to 10% by weight, preferably 1 to 6% by weight based on encapsulant [A].

Encapsulant [A] may be used in semi-cured state or B stage if desired.

Figure 2:
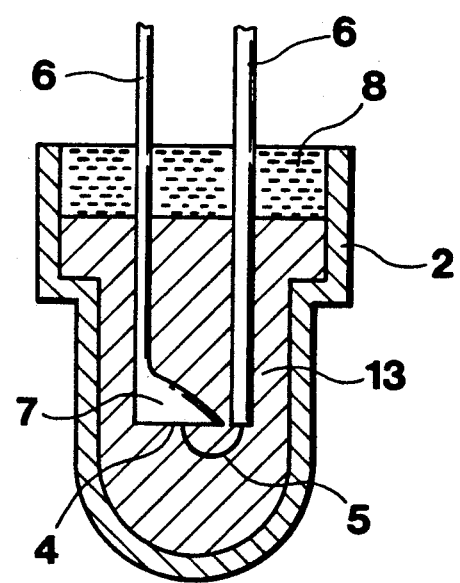
FIG. 2 is a vertical cross section illustrating an encapsulating method.

The method for encapsulating the element 4 with encapsulant [A] is not particularly limited insofar as the method can form the polymer 3 (see FIG. 1) by placing the element 4 in a mold 2, filling the mold with encapsulant [A] 13, polymerizing encapsulant [A] as shown in FIG. 2. The following encapsulating method is preferred.

(1) Encapsulant [A] is polymerized in the mold while the surface of encapsulant [A] 13 in the mold is in contact with an inert gas atmosphere having an oxygen concentration of up to 1%, preferably up to 0.5%, more preferably up to 0.01%.

If encapsulant [A] to be polymerized in the presence of a radical polymerization initiator is in contact with air, oxygen will consume active radicals so that the surface of the polymerizing encapsulant in contact with air may sometimes remain liquid or gel without reaching a sufficient molecular weight.

In order to complete polymerization evenly so that the surface hardness may reach a pencil hardness of at least 2B, preferably at least HB, the atmosphere under which polymerization is carried out should be an inert gas such as nitrogen and argon having an oxygen concentration of up to 1%, preferably up to 0.5%, more preferably up to 0.01%.

(2) Encapsulant [A] is polymerized in the mold while the surface of encapsulant [A] 13 in the mold is covered with a liquid [C] 8 having low solubility in encapsulant [A] 13 and a lower density than encapsulant [A] 13.

Liquid [C] is not particularly limited as long as it is less soluble in encapsulant [A] and has a lower density than encapsulant [A].

The density of liquid [C] is preferably from 0.7 to 1 g/cm$^3$, more preferably from 0.8 to 0.95 g/cm$^3$.

Consumption of radicals in encapsulant [A] can be controlled for the same reason as in method (1).

Liquid [C] may be water, for example, which seals any opening to block oxygen. Water is suitable for polymerization at relatively low temperatures because of its high vapor pressure.

Liquid [C] may also be a liquid synthetic hydrocarbon polymer having a low molecular weight or a liquid hydrocarbon mixture such as mineral oil.

Examples of the synthetic hydrocarbon polymers include poly($\alpha$-olefin) oils such as polydecene-1, alkyl aromatic oils such as alkylbenzenes, polybutene oil or liquid polybutene, polyhexene, alkylnaphthene oils such as 2,4-dicyclohexyl-2-methylpentane oil, and ethylene-$\alpha$-olefin random copolymer oils such as ethylene-propylene random copolymer oil.

Preferred among them are those having a molecular weight of at least 500, more preferably from 1,000 to 10,000.

Also preferred are ethylene-$\alpha$-olefin random copolymer oils having a number average molecular weight ($\overline{Mn}$) of from 500 to 5,000, especially from 1,500 to 3,000.

Particularly preferred are liquid, low-molecular weight ethylene-$\alpha$-olefin copolymers consisting of 30 to 70 mol % of ethylene units and 30 to 70 mol% of $\alpha$-olefin units and having a number average molecular weight ($\overline{Mn}$) of from 1,000 to 5,000 and a Q value (weight average molecular weight/number average molecular weight) of up to 3.

When liquid [C] is a liquid polyolefin or the like, the liquid itself exhibits mold release effect, considerably facilitating mold release operation. At the end of polymerization, the liquid polyolefin may be readily removed with an organic solvent such as hexane, kerosene, and trichloroethylene.

(3) Encapsulating methods (1) and (2) may be combined.

Encapsulant [A] is polymerized in the mold while the surface of encapsulant [A] in the mold is covered with liquid [C] and further with an inert gas atmosphere having an oxygen concentration of up to 1%.

Better results are obtained from the combined use of encapsulating methods (1) and (2).

Polymerization may be carried out under various conditions depending on the identity of polymerization initiator. In the case of thermal polymerization, the composition may be heated in a heating tank to a temperature of about 30° to 150° C., preferably about 40° to 120° C. for about ½ to 72 hours, preferably about 1 to 4 hours, although the exact value will vary with the shape and size. In the case of photo polymerization, polymerization may be carried out under a high-pressure mercury lamp with a power of 60 to 150 W/cm for about 1 minute to 2 hours, preferably 3 to 30 minutes at a temperature of about 40° to 120° C., preferably about 60° to 100° C.

EXAMPLES

Examples of the present invention are given below by way of illustration.

EXAMPLE 1

An assembly of a GaAlAs light-emitting diode with lead frames was set in a mold of polypropylene having an inner diameter of 5 mm and a depth of 10 mm. The mold was charged with a homogeneously mixed liquid composition given below as encapsulant [A]-I. The mold was placed in a vacuum oven, which was purged with argon gas and then heated stepwise from 40° C. to 90° C., completing polymerization in 3 hours.

| [A]-I | |
|---|---|
| The reaction product obtained by reacting diallyl carbonate with diethylene glycol in a molar ratio of 2:1 in the presence of sodium ethoxide under the conditions described in Japanese Patent Application Kokai No. 56-133246 (consisting of 30% by weight of diethylene glycol bisallyl carbonate and 70% by weight of oligo-carbonate, n = 3 to 10) | 55% by weight |
| Tris(allyl carbonate) of tris(hydroxyethyl) isocyanurate obtained by reacting diallyl carbonate with tris(hydroxyethyl) isocyanurate in a molar ratio of 12:1 | 12.4% by weight |
| Diethylene glycol bisallyl carbonate | 27.5% by weight |
| Vinyl acetate | 5% by weight |
| Polymerization initiator (per 100 parts of the foregoing ingredients) | |
| Diisopropyl peroxydicarbonate | 2.5 pbw |

EXAMPLE 2

An assembly of a light-emitting diode with lead frames was set in a mold of TPX® having an inner diameter of 5 mm and a depth of 10 mm as shown in FIG. 2. A composition given below as encapsulant [A]-II was cast into the mold and then covered with a layer of a liquid ethylene-propylene copolymer (Mn 2500, Q 2.0, specific gravity 0.846) having a thickness of about 2 mm. The mold was placed in an air oven, which was heated stepwise from 40° C. to 90° C., completing polymerization in 3 hours.

| [A]-II | |
|---|---|
| The reaction product obtained by reacting diallyl carbonate with diethylene glycol in a molar ratio of 2:1 in the presence of sodium ethoxide under the conditions described in Japanese Patent Application Kokai No. 56-133246 (consisting of 30% by weight of diethylene glycol bisallyl carbonate and 70% by weight of oligo-carbonate, n = 3 to 10) | 58% by weight |
| Tris(allyl carbonate) of tris(hydroxyethyl) isocyanurate obtained by reacting diallyl carbonate with tris(hydroxyethyl) isocyanurate in a molar ratio of 12:1 | 13% by weight |
| Diethylene glycol bisallyl carbonate | 29% by weight |
| Polymerization initiator (per 100 parts of the foregoing ingredients) | |
| Diisopropyl peroxydicarbonate | 2.7 pbw |

EXAMPLE 3

The procedure of Example 2 was repeated except that encapsulant [A]-II was replaced by [A]-I, completing polymerization in 3 hours as in Example 2.

COMPARATIVE EXAMPLE 1

An assembly of a light-emitting diode with lead frames was set in a mold of TPX® having an inner diameter of 5 mm and a depth of 10 mm as shown in FIG. 2. An epoxy resin of the light-emitting diode encapsulating grade was cast into the mold, the epoxy resin consisting of 100 parts of a major agent, Pelnox XN-1886-3 and 110 parts of a curing agent, Pelcure XV-2263 (manufactured by NIPPON PELNOX K.K.). The epoxy resin was cured at 120° C. for 8 hours.

The light-emitting or receiving devices obtained in the foregoing Examples and Comparative Example were evaluated as follows, with the results shown in Table 1.

(1) Mold Release

Mold release was evaluated by removing the cured resin from the mold without using a mold release agent.
⊚: very easily releasable
○: manually releasable
X: manually unreleasable

(2) Transparency

Visual observation
○: good
⊚: excellent

In the case of Comparative Example only, evaluation was made by removing the cured resin using a silicone mold release agent for light-emitting diodes. No mold release agent was used in Examples.

Separately, encapsulants [A]-I and [A]-II were polymerized into plates of 3.0 mm thick by the same method as described for Examples 1-3 and Comparative Example 1 and measured for light transmittance using a spectrophotometer.

Light transmittance measurement: auto-recording spectrophotometer, model U-3400 of Hitachi, Ltd.

(3) Weathering test (a)

Using an accelerated weathering tester (model SUV-W11 of Iwasaki Electric K.K.), a sample was exposed to light under the following conditions.
Ultraviolet intensity: 100 mW/cm$^2$
Black panel temperature: 63° C.
Relative humidity: 50-70%
A cycle consisting of an exposure time of 8 hours and a dewing time of 4 hours was repeated to a total exposure of 48 hours.

Weathering test (b)

Accelerated weathering tester (model WEL-6X-HC-BEC of Suga Tester K.K.).
Light source 6.0 kW xenon lamp
Black panel temperature: 63° C.
Relative humidity: 50%
A cycle consisting of an exposure time of 200 minutes (including a raining time of 18 minutes) was repeated to a total exposure of 100 hours.

The light transmittance and luminous power were measured before and after the above-mentioned weathering tests.

(4) Surface hardness

A barrel portion of the encapsulant was measured for surface hardness by a similar method according to JIS K5401.

TABLE 1

|  | Example | | | Comparative |
|---|---|---|---|---|
|  | 1 | 2 | 3 | Example 1 |
| Mold release | ○ | ⊚ | ⊚ | X |
| Transparency | ⊚ | ⊚ | ⊚ | ○ |

TABLE 1-continued

|  | Example | | | Comparative |
|---|---|---|---|---|
|  | 1 | 2 | 3 | Example 1 |
| Polymerizing time | 3 hrs. | 3 hrs. | 3 hrs. | 8 hrs. |
| Weathering test (a) | | | | |
| (1) Light transmittance, % | | | | |
| Before test | | | | |
| 760 nm | 92 | 92 | 92 | 84 |
| 620 nm | 92 | 92 | 92 | 81 |
| 400 nm | 90 | 90 | 90 | 69 |
| After test | | | | |
| 760 nm | 92 | 92 | 92 | 83 |
| 620 nm | 92 | 92 | 92 | 78 |
| 400 nm | 83 | 83 | 83 | 33 |
| Weathering test (b) | | | | |
| (2) Luminous power, mW | | | | |
| Before test | — | 2.3 | — | 2.3 |
| After test | — | 2.2 | — | 2.0 |
| Surface hardness | 4H | 4H | 4H | 3H |

The light-emitting or receiving device of the present invention which is encapsulated with a specific polymer has improved weatherability, chemical resistance, hardness, and optical properties such as transparency.

The encapsulant of the present invention is used in light-emitting or receiving devices having the above-mentioned characteristics and has a reduced curing time and improved mold release after curing.

The applications in which the light-emitting or receiving device of the present invention is utilized include light emitting devices such as LED, laser diodes, photosensors, photodiodes, and electroluminescence cells as well as light-receiving devices such as photodiodes.

The encapsulating method of the present invention using a cover liquid can produce a light-emitting or receiving device with a high surface hardness. The device can be readily removed from the mold because the cover liquid has mold release property.

The encapsulating method of the present invention using an inert gas atmosphere having an oxygen concentration of up to 1% can produce a light-emitting or receiving device with a high surface hardness at a low cost because the product and the mold need not be cleaned after molding.

We claim:

1. A light emitting or receiving device which comprises an optically transparent light emitting or receiving encapsulant resin whose surface is smooth and hard and a light-emitting or receiving element encapsulated within said encapsulant, wherein said encapsulant is obtained by polymerizing a polymerizable liquid composition which comprises
    (a) 10 to 90% by weight of an oligomer or a mixture of oligomers of a bis(allyl carbonate) of an aliphatic, cycloaliphatic or aromatic dihydric alcohol having the formula:

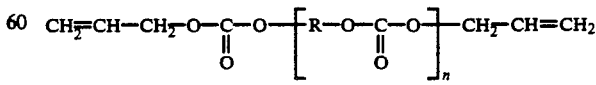

wherein R is a residue of a dihydric alcohol, and n has a value or an average value in the range of from 1 to 10, with the proviso that the content of a dihydric alcohol bis(allyl carbonate) monomer optionally present in the oligomer is up to 50% by weight;

(b) 0 to 90% by weight of compound selected from the group consisting of (b-1) a monomeric di- or tri-(allyl carbonate) or an aliphatic, cycloaliphatic or aromatic di- or trihydric alcohol having the formula:

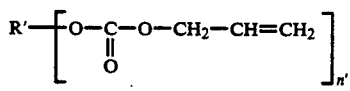

wherein R' is a residue of a di- or trihydric alcohol, and n' is equal to 2 or 3, or a mixture thereof, with the proviso that the content of an oligomeric di(allyl carbonate) of a di- or trihydric alcohol or a poly(allyl carbonate) of a di- or trihydric alcohol optionally present in the monomer or the mixture is up to 30% by weight, (b-2) an allyl ester of an aliphatic or aromatic di- or tricarboxylic acid having the formula:

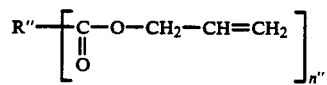

wherein R" is a residue of a di- or tricarboxylic acid, and n" is equal to 2 or 3, and (b-3) triallyl cyanurate and triallyl isocyanurate; and (c) 0 to 30% by weight of an arcylic or vinyl monomer; with the proviso that the total of components (b) and (c) is more than 0, wherein said light emitting or receiving element has been encapsulated with said encapsulant by the steps of placing said light-emitting or receiving element in a mold, casting said encapsulant into the mold, and polymerizing said encapsulant in the presence of a radical polymerization initiator while a liquid (C) with low solubility in said encapsulant and a lower density than said encapsulant is present on said encapsulant, whereby the polymerization of the liquid composition proceeds evenly.

2. A light-emitting or receiving device according to claim 1 wherein said diallyl compound is a bis(allyl carbonate) of an aliphatic cycloaliphatic or aromatic dihydric alcohol.

3. The light emitting or receiving device according to claim 1 wherein component (a") comprises the reaction product of dialkyl carbonate and a dihydric alcohol selected from the group consisting of ethylene glycol, 1,3-propanediol, 1,4-butene diol, 1,6-hexanediol, diethylene glycol, polyethylene glycol, dipropylene glycol, propylene glycol, neopentyl glycol, trimethylpentane diol, cyclohexane diemthanol, bis(hydroxy-methyl)-tricyclodecane, 2,7-norbornane diol, $\alpha,\alpha'$-xylene diol, 1,4 bis(hydroxyethoxybenzene), and 2,2-bis(4-(hydroxy-ethoxy)-phenyl) propane, in a molar ratio of 2:1.

4. The light emitting or receiving device according to claim 1 wherein component (b) comprises the reaction product of dialkyl carbonate and di- or trihydric alcohol selected from the group consisting of ethylene glycol, 1,3-propanediol, 1,4-butanediol, 1,6-hexanediol, diethylene glycol, polyethylene glycol, dipropylene glycol, propylene glycol, neopentyl glycol, trimethylpentane diol, cyclohexane dimethanol, bis(hydroxymethyl) tricyclodecane, 2,7-norbornane diol, $\alpha, \alpha'$-xylene diol, 1,4-bis(hydroxyethoxybenzene), 2,2-bis(4-hydroxythoxy) phenyl)propane, trimethylol propane, tri(hydroxyethyl) isocyanurate, and mixtures thereof, in a molar ratio of 12:1.

5. The light emitting or receiving device according to claim 1 wherein component (c) is selected from the group consisting of vinyl acetate, vinyl benzoate, methyl methacrylate, phenyl methacrylate, methyl acrylate, methyl maleate, maleic anhydride, vinylidene chloride, and mixtures thereof.

6. The light-emitting or receiving device according to claim 1, wherein said liquid (C) is a liquid synthetic hydrocarbon polymer having a low molecular weight, a liquid hydrocarbon mixture, or a mixture thereof.

* * * * *